(12) United States Patent
Tang (10) Patent No.: US 8,301,972 B2
(45) Date of Patent: Oct. 30, 2012

(54) APPARATUS FOR CORRECTING SINGLE BIT INSERTION OR DELETION IN A DATA PAYLOAD WITH A CHECKSUM CORRECTOR

(75) Inventor: Yawshing Tang, Saratoga, CA (US)

(73) Assignee: Seagate Technology LLC, Cupertino, CA (US)

( * ) Notice: Subject to any disclaimer, the term of this patent is extended or adjusted under 35 U.S.C. 154(b) by 765 days.

(21) Appl. No.: 12/473,207

(22) Filed: May 27, 2009

(65) Prior Publication Data

US 2010/0306612 A1 Dec. 2, 2010

(51) Int. Cl.
*H03M 13/00* (2006.01)
(52) U.S. Cl. ......................... 714/758; 714/807
(58) Field of Classification Search ................... 714/758, 714/807
See application file for complete search history.

(56) References Cited

U.S. PATENT DOCUMENTS

| | | | |
|---|---|---|---|
| 6,684,363 B1 * | 1/2004 | Cassiday et al. | 714/776 |
| 6,820,233 B2 * | 11/2004 | Johansson et al. | 714/808 |
| 7,428,668 B2 * | 9/2008 | Kikuchi et al. | 714/701 |
| 7,436,836 B2 * | 10/2008 | Mushtaq et al. | 370/392 |
| 7,447,949 B2 * | 11/2008 | Kikuchi et al. | 714/701 |
| 8,032,813 B2 * | 10/2011 | Richard | 714/757 |

* cited by examiner

*Primary Examiner* — Esaw Abraham
(74) *Attorney, Agent, or Firm* — Hollingsworth Davis, LLC (57) ABSTRACT

This application discloses a message format including a data payload of N bits and a corrector component encoding a checksum to correct the checksum of single bit slipping noise, where the checksum is the sum of each data payload bit by its position modulo N+1. The corrector component may encode a second checksum derived from the checksum that may also be included in the message and so on. Apparatus embodiments may include a transmitter generating a transmitted message of this format and/or a receiver using a received message that may be corrupted from the transmitted message through bit slipping in the form of bit insertion or bit deletion.

19 Claims, 6 Drawing Sheets

Fig. 11

APPARATUS FOR CORRECTING SINGLE BIT INSERTION OR DELETION IN A DATA PAYLOAD WITH A CHECKSUM CORRECTOR

TECHNICAL FIELD

This invention relates to the correction of data payloads where the transmission error is a single bit inserted or deleted.

BACKGROUND OF THE INVENTION

There are communication systems that rely on the synchronization of transmitter and receiver clocks to correctly transfer data payloads. One class of such systems involves transmitters and receivers separated by large distances, such as satellite communications with a ground station. The clocks at the transmitters and receivers may drift occasionally, causing single bits to be inserted or deleted between the data payload the transmitter tried to send and what is received.

Figure 1A:
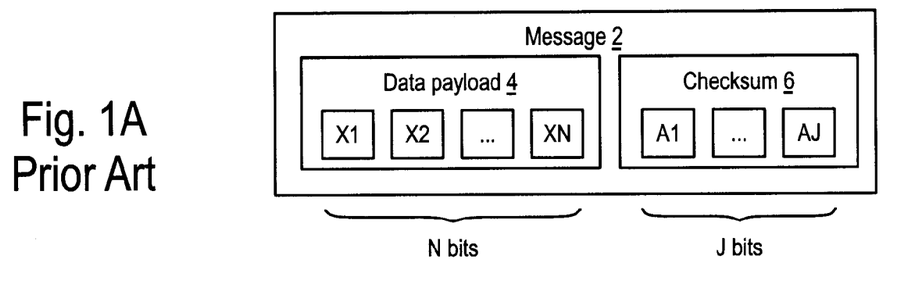
FIG. 1A shows a message of the prior art including a data payload of N bits and a checksum of J bits.

FIG. 1A shows an example of a prior art message 2 including a data payload 4 of N bits and a checksum 6 of J bits as in a Cyclic-Redundant Code (CRC). Such prior art error correction schemes assume the received checksum to be uncorrupted in almost all bit positions.

Figure 1B:
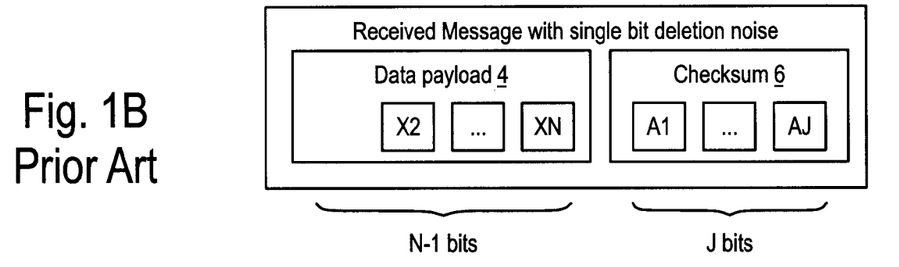
FIGS. 1B and 1C show the central problem with most prior art error correction-detection schemes, when an early bit is deleted from such a message as in FIG. 1B or inserted as in FIG. 1C, these schemes see all the bits that follow as wrong, making error correction impractical.
Figure 1C:
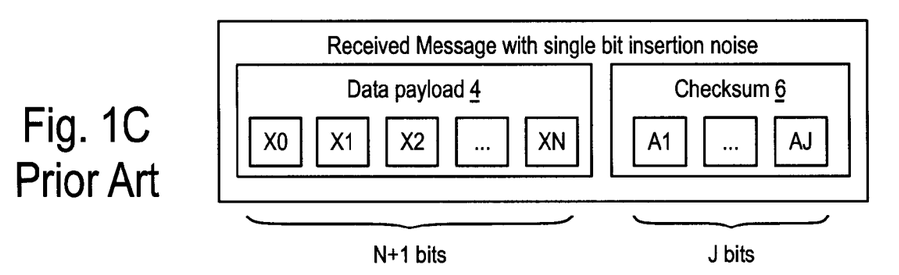

If the bits of the message 2 are treated alike, then insertion or deletion of a bit is equally probable at any bit location and the received data payload and checksum may be corrupted in many if not almost all bits. FIGS. 1B and 1C show the central problem with most prior art error correction-detection schemes, when an early bit is deleted from such a message as in FIG. 1B or inserted as in FIG. 1C, these schemes see all the bits that follow as wrong, making error correction impractical.

While there have been sporadic research results for error correction in the presence of bit insertions and deletions, systematic error correcting codes of more than 8 bits have proved computationally difficult, according to a recent survey article by N. J. A. Sloane, "On Single-Deletion-Correcting Codes", last updated 2002. As mentioned in that article, error correction for a channel inserting single bits is very similar to what was surveyed for deleting single bits. A message protocol is needed that can minimize the damage from bit insertion or bit deletion noise for messages much longer than today's 8 bit limitation discussed in Sloane's article.

SUMMARY OF THE INVENTION

Embodiments of the invention include a message format for a channel experiencing single bit slip noise. The single bit slip noise may be caused by single bit insertion in some embodiments. Alternatively, the single bit slip noise may be caused by single bit deletion. The method of error correction is not based upon a fundamental breakthrough in error control coding, but on solving smaller problems that lead to a solution of the large problem.

The message format may include a data payload of N bits, and a corrector component including a first checksum of J=IntLog2 of N bits and a checksum corrector that supports correcting the single bit slip noise. The first checksum may be the sum of each data payload bit multiplied by its position modulo N+1. This allows the use of existing error correcting codes to be applied to the checksum of up to J=8 bits, for data payloads of up to 127 bits. The received corrector component allows the checksum to be correctly derived in the presence of single bit slipping noise. With the corrected checksum, the received data payload can be corrected for single bit slipping noise.

In certain embodiments of the invention, the data payload may be larger and the message format may include the first checksum and the corrector component of a second checksum as the sum of each checksum bit multiplied by its position modulo J+1 to create the second checksum as a single bit deletion error correcting checksum of the first checksum. The checksum corrector is now applied to the second checksum. Decoding proceeds by first recovering the second checksum from the corrector component, then recovering the data payload from the received data payload and the corrected first checksum.

A second message format supports much larger data payloads of length N using three checksums, with the corrector component including the third checksum and a third checksum corrector. Example: Given N<4096, then J<=12 and K<=4. Decoding proceeds by first recovering the second checksum from the corrector component, then the first checksum from the received first checksum and the corrected second checksum, followed by recovering the data payload from the received data payload and the corrected first checksum.

Apparatus embodiments of the invention may include a transmitter generating a transmitted message of this format and/or a receiver using a received message that may be corrupted from the transmitted message through bit deletion or insertion. The transmitter implements a multiple checksum process to create the transmitted message from data input. The receiver implements a multiple checksum error correction-detection process to generate a received data output from the received message. Both processes are embodiments of the invention.

The transmitter and/or the receiver may include a processor to implement the processes. Each processor may include at least one instance of a finite state machine and/or a computer. The process embodiments may be implemented as a program system residing in a computer readable memory configured to be accessed by a computer.

DETAILED DESCRIPTION

This invention relates to the correction of data payloads where the most common transmission error is a single bit inserted or deleted, also known as bit-slipping, which is particularly useful in communication systems that rely on the synchronization of transmitter and receiver clocks to correctly transfer data payloads.

Embodiments of the invention include a message format including a data payload of N bits, a first checksum of j=IntLog2 of N bits and a second checksum of IntLog2 of IntLog2 of N bits, where the first checksum is the sum of each data payload bit by its position modulo N+1 and the second checksum is the sum of each checksum bit by its position modulo j+1.

Referring to the drawings more particularly by reference numbers, FIG. 1A shows a message 2 of the prior art including a data payload 4 including an N bits $(x_1 x_2 \ldots x_N)$ and a checksum 6 of j bits $(a_1 \ldots a_j)$ which will be referred to as a, which may not be a CRC coding.

Figure 2A:
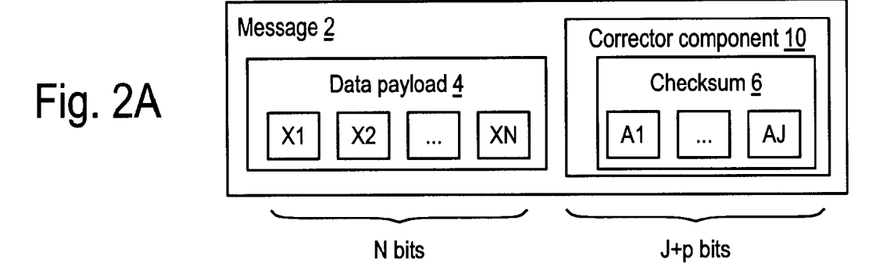
FIG. 2A shows an example of an embodiment of the invention as a message including the data payload and a corrector component of a checksum derived from the data payload with the corrector component generated from the checksum. The received corrector component allows the checksum to be correctly derived in the presence of single bit slipping noise. With the corrected checksum, the received data payload can be corrected for single bit slipping noise.

FIG. 2A shows an example of an embodiment of the invention as a message 2 including the data payload 4 and a corrector component 10 that encodes the checksum 6. The checksum may be derived from the data payload and the corrector component is generated from the checksum. The received corrector component allows the checksum to be correctly derived in the presence of single bit slipping noise. With the corrected checksum, the received data payload can be corrected for that single bit slipping noise. In certain embodiments of the invention, the corrector component may have a fixed checksum associated with it, such as the value 0.

Figure 2B:
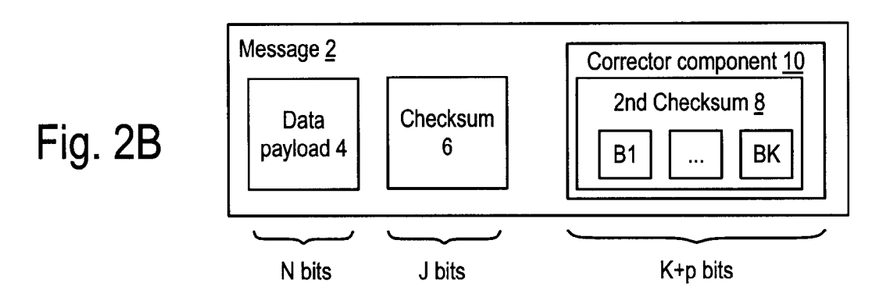
FIG. 2B shows another example of an embodiment of the invention as a message including the data payload, the first checksum as in FIG. 2A and a corrector component of a second checksum derived from the first checksum with the corrector component generated from the second checksum. The received corrector component allows the second checksum to be correctly derived in the presence of single bit slipping noise. With the corrected second checksum applied to the first checksum, the first checksum can be correctly derived in the presence of single bit slipping noise. And with the corrected first checksum and the received data payload, the data payload can be correctly derived in the presence of single bit slipping noise.

FIG. 2B shows another example of an embodiment of the invention as a message 2 including the data payload 4, the first checksum 6 as in FIG. 2A and a corrector component 10 encoding a second checksum 8. The second checksum may be derived from the first checksum and the corrector component may be generated from the second checksum. The received corrector component allows the second checksum to be correctly derived in the presence of single bit slipping noise. With the corrected second checksum applied to the first checksum, the first checksum can be correctly derived in the presence of that single bit slipping noise. And with the corrected first checksum applied to the received data payload, the data payload can be correctly derived in the presence of that noise.

Figure 3:
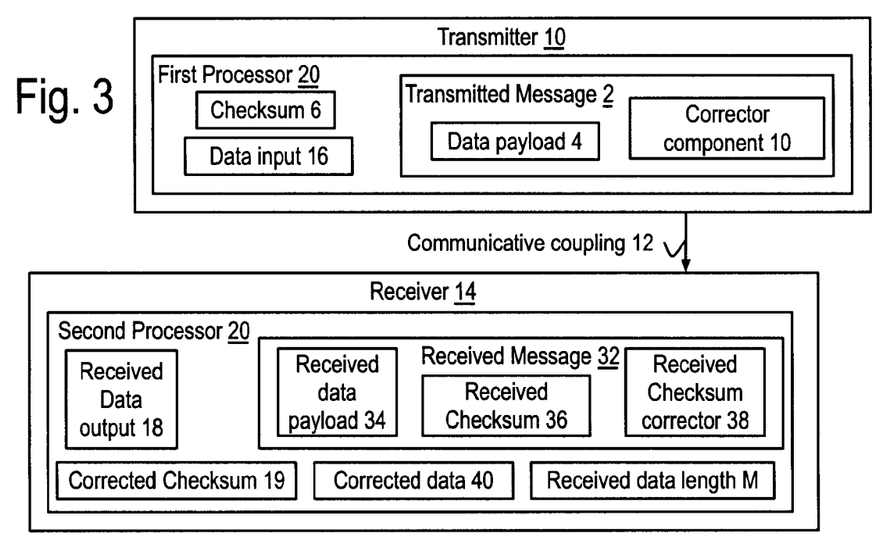
FIG. 3 shows some example apparatus embodiments of the invention that may include a transmitter generating a transmitted message of the format shown in FIG. 2A and/or a receiver using a received message in this format that may be corrupted from the transmitted message through single bit deletion noise as in FIG. 1B or single bit insertion noise as in FIG. 1C. The transmitter uses a first processor to implement an encoding process to create the transmitted message from data input. The receiver uses a second processor to implement a decoding process to generate a received data output from the received message. Both processes are embodiments of the invention.

FIG. 3 shows some example apparatus embodiments of the invention that may include a transmitter 22 generating a transmitted message 2 and/or a receiver 26 using a received message 32 that may be corrupted from the transmitted message through bit deletion as shown in FIG. 1B or bit insertion as in FIG. 1C. The transmitted message and the received message are in the same formats as shown through the example of FIG. 2A. The transmitter may use a first processor 20 to implement an encoding process to create the transmitted message from data input 16. The data input 16 is used to generate the checksum 6 and to create the data payload 4. The checksum is used to encode the corrector component 10. The receiver may use a second processor to implement an error correction-detection process to generate a received data output 18 from the received message. Both processes are embodiments of the invention. The second processor uses the received corrector component 38 to create a corrected checksum. The second processor then uses the corrected checksum with the received data payload 34 to create the corrected data 40.

Figure 4:
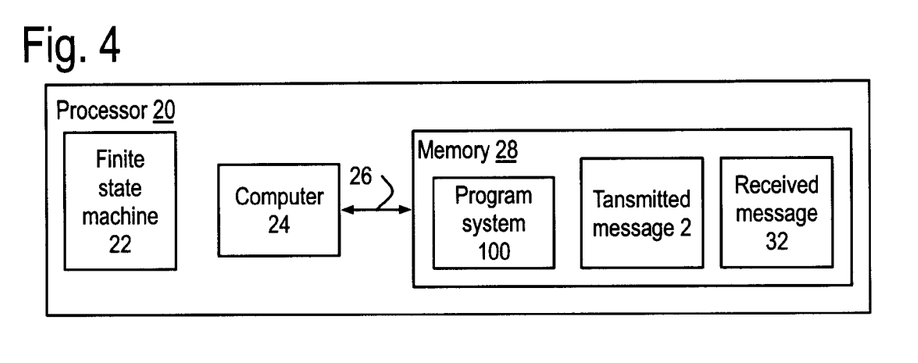
FIG. 4 shows that a processor as used herein may include at least one instance of a finite state machine and/or a computer accessibly coupled via a buss to a computer readable memory containing a program system and the transmitted message and/or the received message.

FIG. 4 shows that a processor 20 as used herein may include at least one instance of a finite state machine 52 and/or a computer 54 accessibly coupled 56 via a buss to a computer readable memory 58 containing a program system 100 and the transmitted message 2 and/or the received message 32. The program system may reside in a volatile and/or a non-volatile memory component. As used herein, a volatile memory component tends to lose its memory state if it is not supplied power, whereas a non-volatile memory component does not tend to lose its memory state in the absence power.

As used herein a finite state machine 52 receives at least one input maintains at least one state and generates at least one output based upon the value of at least one of the inputs and/or of at least one of the states. The state may be altered by the input, the output or the feedback of the state within the finite state machine.

As used herein a computer 54 includes at least one instruction processor and at least one data processor with each data processor being instructed by at least one of the instruction processor, with at least one of the instruction processors instructed by the program steps of the program system 100.

Some of the following figures show flowcharts of at least one embodiment of the method, which may include arrows signifying a flow of control, and sometimes data, supporting various implementations of the invention's operations. These include a program operation, or program thread, executing upon a computer 54, and/or a state transition in a finite state machine 52. The operation of starting a flowchart refers entering a subroutine or a macro instruction sequence in the computer, and/or directing a state transition in the finite state machine, possibly while pushing a return state. The operation of termination in a flowchart refers completion of those operations, which may result in a subroutine return in the computer, and/or popping of a previously stored state in the finite state machine. The operation of terminating a flowchart is denoted by an oval with the word "Exit" in it.

Figure 5:
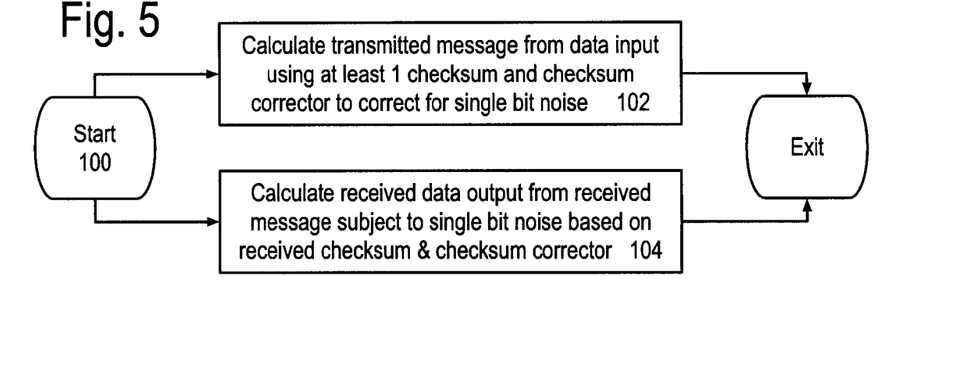
FIG. 5 shows a flowchart of the program system that may include implementations of an encoding process to create the transmitted message from data input and/or of a decoding process to generate a received data output from the received message in the presence of single bit slipping noise.

FIG. 5 shows a flowchart of the program system 100 may include implementations of a process to create the transmitted message from data input and/or of a multiple checksum error correction-detection process to generate a received data output from the received message subject to the single bit slip noise. In particular, program step 102 supports calculating the transmitted message 2 from the data input 16 of FIG. 3 using at least one checksum 6 and the corrector component 10 of FIGS. 2A, 2B and/or 12. The corrector component may correct for the single bit slip noise. And program step 104 supports calculating the received output data 18 from the received message 32 subject to the single bit slip noise with error correction-detection based upon received data payload 34 and the received corrector component 38.

Figure 6:
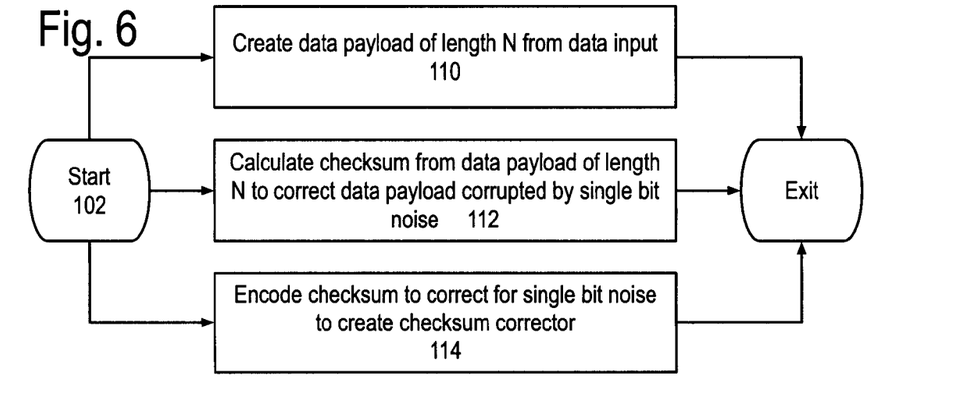
FIGS. 6 and 7 show flowcharts of some details of creating the transmitted message from the data input.

FIG. 6 shows a flowchart of some details of the program step 102 creating the transmitted message from the data input. Program step 110 supports creating the data payload 4 of the length N from the data input 16 of FIG. 3. Program step 112 supports calculating the first checksum 6 from the data payload of length N. Program step 114 encodes the first checksum to correct for single bit slip noise to create the corrector component 10.

Figure 7:
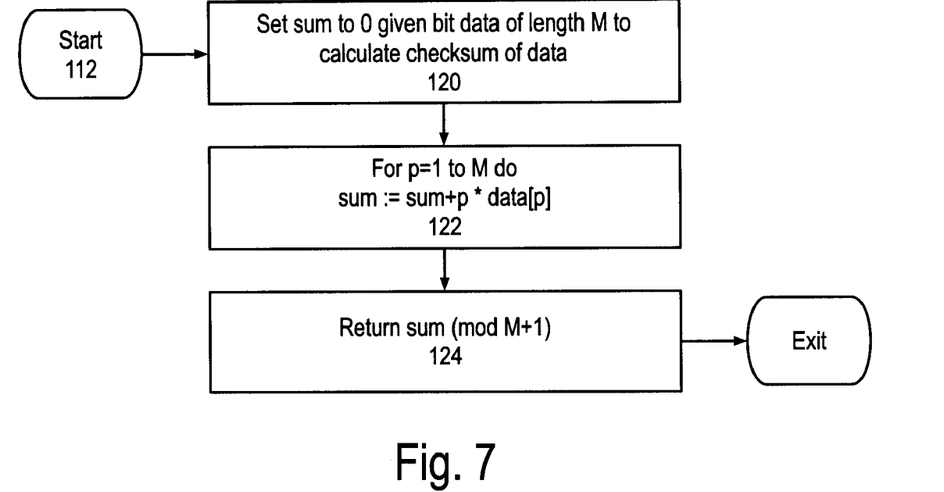

FIG. 7 shows a flowchart of some details of the program steps 112 calculating a checksum for bit data of length M. Program step 120 sets a sum to zero given the bit data. Program step 122 iteratively accumulates over the position p starting from 1 to M of the sum of p multiplied by the data[p] representing the $p^{th}$ bit in the bit data. Program step 124 returns that sum modulo M+1. Note that in some embodiments of the apparatus a computer 24 may be using these program steps as a subroutine or function call, whereas in other embodiments, these operations may be implemented as a sequence of instructions without any call and return mechanism involved.

The basic encoding process shown in FIGS. 6 and 7 calculates the checksum 6 from the data payload 4 represented as a stream of length N of the bits $x_i$ as $$a = \sum_{i=1}^{N} x_i i (\text{mod} N(+1)) \quad (1)$$

Where $j=\text{Log}_2$ (N), the number of bits in a, is the rounded up version of the logarithm base 2 of the number of bits N in the data payload 4. By way of example, if N=256 then j=8.

The encoding 114 creates the corrector component 10 from the first checksum 6, which may perform a table look-up, using the first checksum as an index into the table to retrieve the checksum corrector as the table entry.

Figure 8:
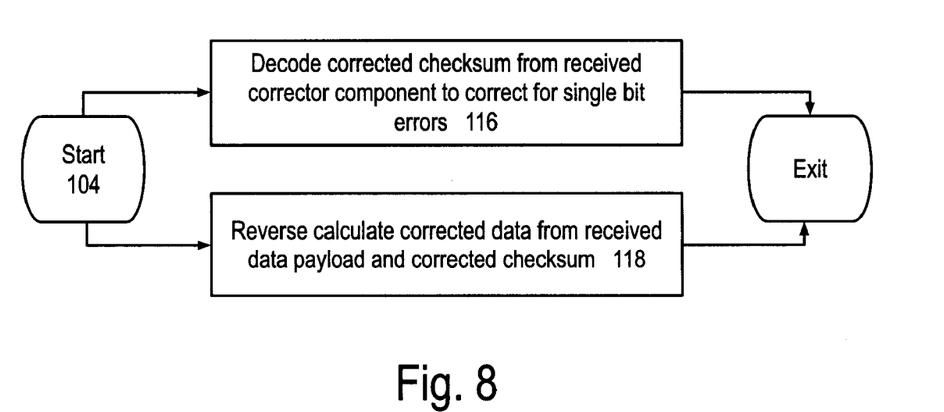
FIGS. 8 to 9 show flowcharts of some of the details of reverse calculating the received data output 18 from the received message 32 with error correction-detection based upon the received data, possibly received correction component.

FIG. 8 shows a flowchart of some details of program step 104 calculating the received output data 18 from the received message 32 subject to the single bit slip noise with error correction-detection based upon the received corrector component 38. Program step 116 decodes a corrected checksum 19 from the received corrector component to correct for the single bit slip noise that may be in the first second checksum. Program step 118 reverse calculates the received data output 18 from the received data payload 24 and from the corrected checksum.

Figure 9:
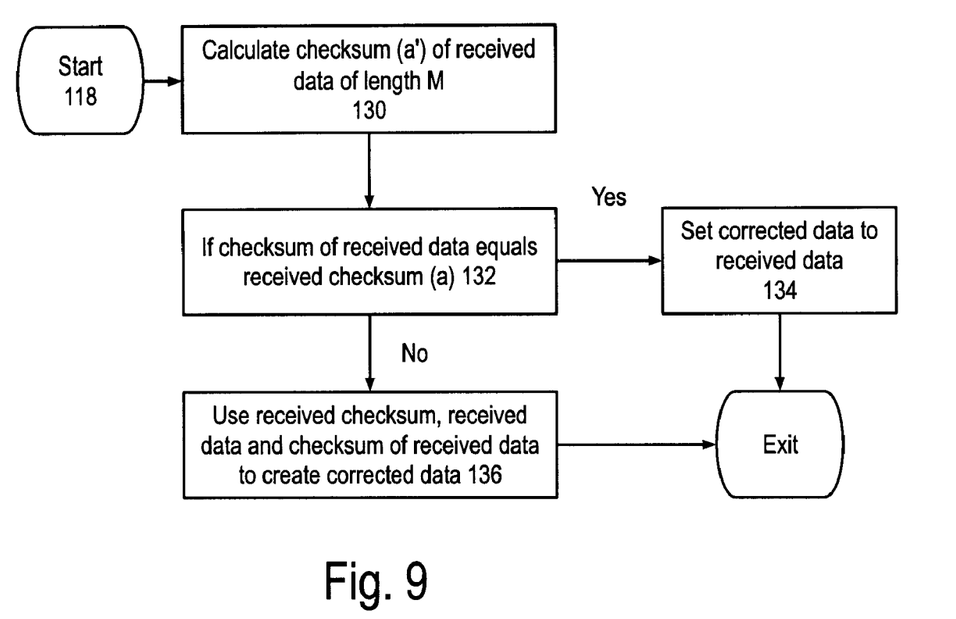

FIG. 9 shows a flowchart of the program step 114 of FIG. 8 that reverse calculates from a corrected data 40 of length M. Program step 130 calculates the checksum a' of the received data of length M. Denote the received data as $(y_1 \, y_2 \ldots y_M)$ and that the received checksum is a. Calculate the checksum of the received data payload as $$a' = \sum_{i=1}^{M} y_i i (\text{mod} M + 1) \quad (2)$$

Continuing with the flowchart of FIG. 9, program step 132 determines if the received checksum a equals the checksum a' of the received data, then no errors are detected in the transmission and the corrected data is set to the received data by program step 134. Program step 136 supports the otherwise situation by using the received checksum, the received data, and the checksum of the received data to create the corrected data 40.

Program step 136 may be to determine which bit has either been inserted or deleted in the received data payload 34. Determining which bit has been deleted is directly found in Sloane's paper and determining which bit has been added is similar to the discussion in that paper.

Figure 10:
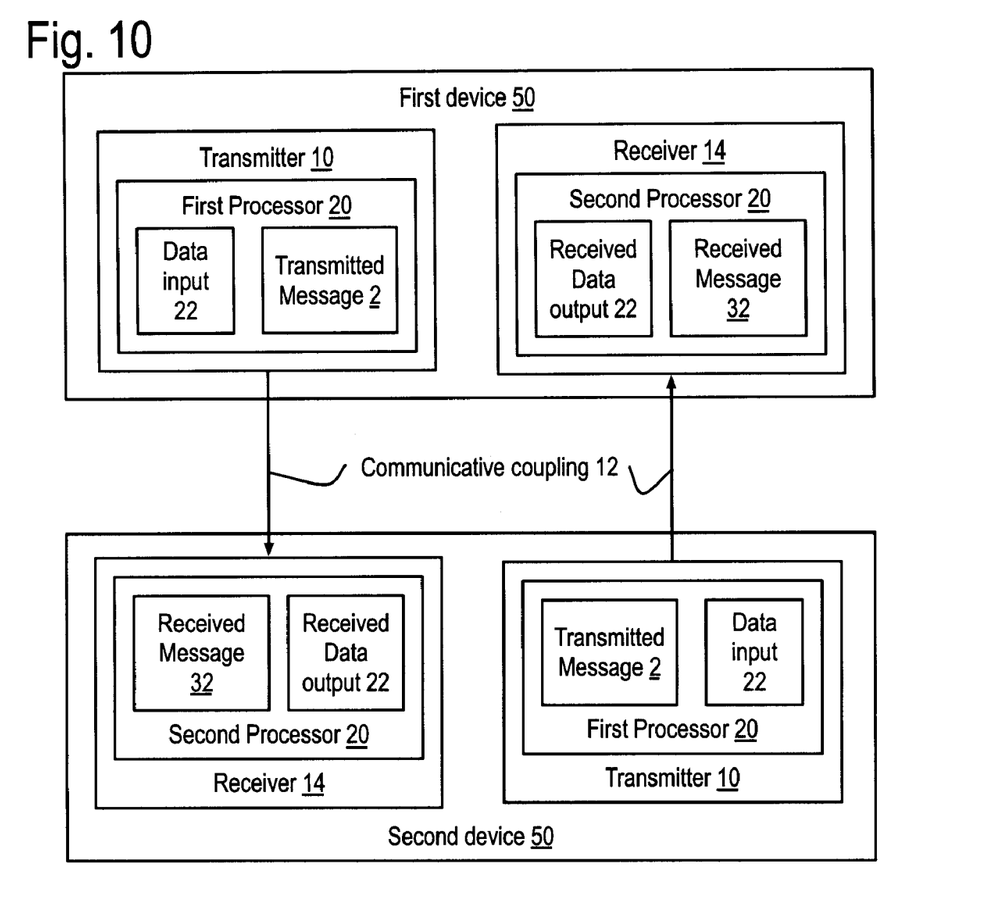
FIG. 10 shows a block diagram example of communications between a first device and a second device, with a communicative coupling potentially supporting a bidirectional communications, with the transmitter of the each device communicating to the receiver of the other device. Note that in some embodiments of the invention, one of the devices may include a single processor to support both the transmitter and the receiver of that device.

FIG. 10 shows a block diagram example of communications between a first device 50 and a second device 50, with a communicative coupling 24 potentially supporting a bidirectional communications, with the transmitter 22 of the each device communicating to the receiver 26 of the other device.

The devices 50 may include transmitters 22 and receivers 26 separated by large distances, such as a satellite as a first device 50 communicating 24 with a ground station as the second device 50, which may be a fixed position facility, a moving vehicle or a mobile communications device such as a portable communications terminal or telephone. The communicative coupling 24 may include at least one wireless physical transport. The device 50 may include a single processor 20 to create the transmitted message 2 and process the received message 32 into the received data output 22.

Note that in some embodiments of the invention, the length of the data payload 4 may be included as part of a message. In some situations that length may be part of the message for that payload. In other situations the length of the data payload may be sent in a preceding message.

Figure 11:
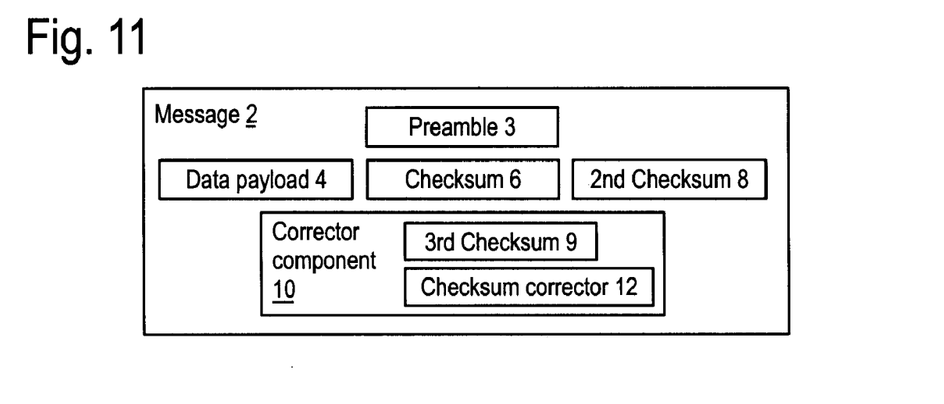
FIG. 11 shows an example of some refinements of the message format of FIG. 2, possibly including a preamble and/or possibly using three checksums, with the corrector component encoding a small enough third checksum to error correct single bit deletions or alternatively, single bit insertions upon reception across a single bit slipping channel.

FIG. 11 shows some variations in the format of the message 2, which may further include a preamble 3 that may act as a synchronization sequence, often composed of a long string of a constant bit such as '0'. This may be sent by transmitters to be used by the receivers to detect the start of the message and is usually not considered part of the message for which error correction is applied.

A refinement of the message 2 as shown in FIGS. 2A and 2B supports much larger data payloads 4 using more than two, for example three checksums, the first checksum 6 as before, the second checksum 8 as the sum of each first checksum bit multiplied by its position modulo J+1. The length of the second checksum will be referred to as K. The third checksum 9 is derived from the second checksum bits and with the corrector component 10 corrects the single bit slip noise to create a corrected third checksum. Example: Given N<4096, then J<=12 and K<=4.

The preceding embodiments provide examples of the invention, and are not meant to constrain the scope of the following claims.

What is claimed is:

1. A system, comprising:
a transmitter configured to transmit a message via a communicative coupling to a receiver, the message susceptible to corruption by single bit transmission error and comprising:
a data payload comprising N bits;
a checksum comprising J bits, wherein said checksum is a sum modulo N+1, the sum is a sum of products, and each product is a product of each data payload bit multiplied by a position of each data payload bit; and
a corrector component encoding said checksum to correct said single bit transmission error in said checksum to correctly determine said checksum.

2. The system of claim 1, further comprising a first device including said transmitter and a second device including said receiver.

3. The system of claim 2, wherein said first device is a satellite and said second device is a ground station.

4. The system of claim 1, wherein said single bit transmission error effects a single bit deletion in said transmitted message.

5. The system of claim 1, wherein said single bit transmission error effects a single bit insertion in said transmitted message.

6. A device, comprising:
a receiver including a processor configured to receive and operate upon a transmitted message susceptible to single bit transmission error, the transmitted message comprising:
a data payload comprising N bits;
a checksum comprising J bits, wherein said checksum is a sum modulo N+1, the sum is a sum of products, and each product is a product of each data payload bit multiplied by a position of each data payload bit; and
a corrector component encoding said checksum to correct said single bit transmission error in said checksum to correctly determine said checksum;
wherein said processor is configured to implement a checksum error correction-detection process on the transmitted message received by the receiver (received message) to generate a received data output corrected of said single bit transmission error.

7. The device of claim 6, wherein:
said transmitted message received by the receiver (received message) includes a received data payload, a received checksum and a received second checksum;
said processor includes at least one instance of at least one member of the group consisting of a finite state machine and a computer accessibly coupled with a computer readable memory including a program system.

8. The device of claim 7, wherein said processor is configured to:
decode a corrected checksum comprising J bits based upon said received second checksum and said corrected checksum; and
reverse calculate said received data payload comprising N bits based upon said corrected checksum and said received data payload to create the received data output corrected of said single bit transmission error.

9. The device of claim 6, wherein said single bit transmission error effects a single bit deletion in said transmitted message.

10. The device of claim 6, wherein said single bit transmission error effects a single bit insertion in said transmitted message.

11. A device, comprising:
a processor configured to create a transmitted message susceptible to corruption by single bit transmission error, the transmitted message comprising:
a data payload comprising N bits;
a checksum comprising J bits, wherein said checksum is a sum modulo N+1, the sum is a sum of products, and each product is a product of each data payload bit multiplied by a position of each data payload bit; and
a corrector component encoding said checksum to correct said single bit transmission error in said checksum to correctly determine said checksum.

12. The device of claim 11, wherein said processor includes at least one instance of at least one member of the group consisting of a finite state machine and a computer accessibly coupled with a computer readable memory including a program system.

13. The device of claim 12, wherein said processor is configured to:
calculate said checksum; and
encode said corrector component to correct said single bit transmission error in said checksum to correctly determine said checksum.

14. The device of claim 11, wherein said single bit transmission error effects a single bit deletion in said transmitted message.

15. The device of claim 11, wherein said single bit transmission error effects a single bit insertion in said transmitted message.

16. A method, comprising:
generating a transmitted message, wherein said transmitted message is susceptible to a single bit transmission error and includes a data payload comprising N bits, a checksum comprising J bits, and a corrector component encoding said checksum to correct the effect of said single bit transmission error on said checksum;
receiving the transmitted message; and
generating a received data output using the received transmitted message wherein generating the received data output further comprises:
decoding a corrected checksum with a received version of said corrector component to create a corrected checksum without said single bit transmission error; and
reverse calculating using a received version of said data payload and said corrected checksum to create said received data output as said data payload without said single bit transmission error.

17. The method of claim 16, wherein generating said transmitted message further comprises:
calculating said checksum from said data payload comprising N bits; and
encoding said corrector component from said checksum to correct for said single bit transmission error.

18. The method of claim 16, wherein said single bit transmission error effects a single bit deletion in said transmitted message.

19. The method of claim 16, said single bit transmission error effects a single bit insertion in said transmitted message.

* * * * *